(12) United States Patent
Bartlett

(10) Patent No.: US 6,757,848 B2
(45) Date of Patent: Jun. 29, 2004

(54) RECOVERY OF USER DATA FROM PARTIALLY INCORRECT DATA SET IN TAPE DATA STORAGE SYSTEM

(75) Inventor: Paul Frederick Bartlett, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 528 days.

(21) Appl. No.: 09/883,382

(22) Filed: Jun. 19, 2001

(65) Prior Publication Data

US 2002/0194544 A1 Dec. 19, 2002

(51) Int. Cl.[7] .................................................. G06F 11/00
(52) U.S. Cl. ........................ 714/42; 714/5; 714/54; 714/771; 714/755; 714/758; 360/53
(58) Field of Search .............................. 714/42, 52, 49, 714/54, 5, 6, 771, 747, 758, 755, 779; 369/30.22, 30.24; 360/53

(56) References Cited

U.S. PATENT DOCUMENTS

| | | | | |
|---|---|---|---|---|
| 3,996,558 A | * | 12/1976 | Heun | 714/808 |
| 4,549,295 A | * | 10/1985 | Purvis | 714/48 |
| 5,490,149 A | * | 2/1996 | Nylander-Hill | 714/5 |
| 5,731,922 A | * | 3/1998 | Yamasaki et al. | |
| 6,154,866 A | * | 11/2000 | Kawahara et al. | 714/755 |
| 6,282,039 B1 | * | 8/2001 | Bartlett | 360/48 |
| 6,367,047 B1 | * | 4/2002 | McAuliffe et al. | 714/755 |
| 2001/0037484 A1 | * | 11/2001 | Paterson | 714/784 |

FOREIGN PATENT DOCUMENTS

| | | |
|---|---|---|
| WO | 0 437 865 A1 | 7/1991 |
| WO | 96/20474 | 7/1996 |
| WO | 97/04454 | 2/1997 |

OTHER PUBLICATIONS

William Doyle; "A High Capacity, High Performance Small form Factor Magnetic Tape Storage System"; Sep. 1990; IEEE Transactions on Magnetics, vol. 26, No. 5.

* cited by examiner

*Primary Examiner*—Robert Beausoliel
*Assistant Examiner*—Yolanda L. Wilson

(57) ABSTRACT

Herein disclosed a method and apparatus for recovering user data from a data set comprising a plurality of sub data sets, wherein each data set contains a valid data length information, which is compared with an amount of valid user data collected from the data set prior to a sub data set in which an error occurred.

17 Claims, 10 Drawing Sheets

Sub Data Set
(25,272 Bytes)

RECOVERY OF USER DATA FROM PARTIALLY INCORRECT DATA SET IN TAPE DATA STORAGE SYSTEM

FIELD OF THE INVENTION

The present invention relates to the field of data storage.

BACKGROUND TO THE INVENTION

In known data storage systems for storage of digital data, for example linear tape data storage devices according to the linear tape open format (LTO), data is stored as a number of data sets, each of which consists of 16 sub data sets, each sub data set having 25,272 bytes.

Referring to FIG. 1 herein, there is illustrated schematically in perspective view, a tape data storage device suitable for installation into a host computer for performing tape data storage and back-up operations, the device comprising a casing 100 having a front panel 101 containing a port 102 configured to accept a linear tape data storage medium stored on a cassette cartridge; internally a read/write head, tape drive mechanism for transporting the tape past the read/write head, memory, and firmware for encoding/decoding data to be read from and written to the tape data storage medium and an interface for interfacing recovered data to a host computer device.

Referring to FIG. 2 herein, there is illustrated schematically a read channel of a digital data tape storage device operating in linear tape organization (LTO) format. The read channel comprises a read head 200 for reading digital data from a linear tape cassette to a C1 error corrector, for applying C1 error correction to a data stream output from read head 200; a C2 corrector 202 for applying C2 correction to the C1 corrected data stream; a buffer memory 203 for collecting complete sub data sets upon which C2 error correction may be performed; a decompressor 204 for applying decompression to C2 error corrected sub data sets; and a data history buffer memory 205 for accumulating a rolling data window of sub data sets accessible to said decompressor 204 for applying decompression. An output of the read channel comprises an error corrected decompressed data stream comprising a series of data sets, each comprising 16 sub data sets.

Referring to FIG. 3 herein, in a known LTO (linear tape organization) structure, 404,352 bytes of data; forms a data set, of which 403,884 bytes are user data and 468 bytes form a data set information table (DSIT), the data set being sub divided into 16 sub data sets. Each sub data set contains 25,272 bytes of data.

Referring to FIG. 4 herein, each sub data set comprises 25,272 bytes of user data; C1 correction bytes; and C2 correction bytes.

The prior art digital tape storage device performs a read operation as follows:

when data is read back through a read channel of a tape drive device, the read channel typically checks the correctness of the 25,272 bytes user data by verifying first of all the C1 error correction code as the data is read from tape into the tape drive unit, and once the whole sub data set is stored in a buffer of the tape drive device, reads the C2 error correction code.

In the prior art device, if any of the 16 sub data sets is found to be in error, then the hardware or firmware of the tape data storage unit will indicate that the whole data set is in error. However, a 16 bit value is generated indicating which of the 16 sub data sets is found to be in error within the data set.

In the prior art system, if any one of the 16 sub data sets is found to be erroneous, then the whole data set from which that data sub set originated is deemed to be erroneous and is discarded. If the host system attempts to read anything within that data set, then a read error is generated.

Therefore in the prior art system, although each sub data set is effectively independent, the prior art format assumes dependency between all 16 sub data sets in the data set, and stipulates that if any sub data set is found to be erroneous, then the whole data set is deemed to be erroneous.

This feature is based on the assumption that once a bad block of data in a sub data set has been found, any data within the same data set after that corrupted sub data set cannot be trusted to be correct, because compression is applied to the data, and the compression algorithm used relies on a knowledge of preceding data to apply the compression. Therefore, to decompress the data, all the preceding data is required, and if some of that preceding data is erroneous then decompression cannot be effected. The assumption is that for any portion of data within the data set, in order to decompress that data, the compression algorithm generally requires all data in the same data set which has preceded that section of data.

Further, at the beginning of a data set, data from a preceding data set is required in order to decode data at the beginning of the current data set. Therefore, successive data sets are to some extent inter dependent upon each other. For a series of successively read data sets, a sequence of sub data sets needs to be available which includes the access point immediately prior to the required users data, and all intervening sub data sets, for the prior art compression algorithm to decompress the data in the known prior art linear tape open data format.

However, the decompression algorithm itself, has a 1 Kbyte rolling data window. Therefore it does not need to have all 16 sub data sets, and will build up a data history as it reads along the data sets.

The prior art system has a disadvantage that even where required user data has already been correctly read from a data set, and an error occurs in subsequent data within the same data set, which is not required, the required correctly read user data must still be discarded, because the error occurred later on in the subsequent data within the same data set. Useful correctly read data may be discarded, because of errors in unwanted data occurring within the same data set in the prior art system.

The prior art format currently performs a series of read retry operations in order to try to recover a whole data set. However, if all these attempts fail, then the data set is deemed to be unrecoverable and a read error is reported to a host computer resulting in a failed data restore operation.

SUMMARY OF THE INVENTION

Specific implementations according to the present invention aim to provide a method and apparatus which can recover valid user data within data set containing erroneous sub data sets.

Specific implementations of the inventions may operate to check individual sub data sets marked as erroneous within a data set, to determine whether they contain user data. If not, then errors within those sub data sets can be ignored, and a users data can be restored from the data set to a host computer entity.

According to first aspect of the present invention there is provided a method of recovering user data from a data storage medium, wherein said user data is stored on said data storage medium in the format:

a data set comprising a plurality of sub data sets;

each said sub data set comprising a data portion capable of storing user data, a C1 error correction code, and a C2 error correction code; and said data set comprising a valid data length data describing a number of bytes of said data set comprising said user data within said data set;

said method comprising the steps of:

reading at least one said data set;

performing C2 error correction;

determining whether a result of said C2 error correction is successful;

if said result of said C2 error correction is unsuccessful, reading said valid data length data;

calculating an amount of good data from a start of said data set;

comparing said amount of good data with said valid data length data; and depending upon a result of said comparison, accepting user data contained in set data set as valid or rejecting user data contained in said data set as invalid.

According to a second aspect of the present invention there is provided a data storage device capable of recovering user data from a data storage medium, wherein said user data is stored on said data storage medium in the format:

at least one data set comprising a plurality of sub data sets;

each said sub data set comprising a data portion capable of storing user data, and an error correction code; and said data set comprising a valid data length data describing a number of bytes of said data set comprising said user data within said set;

said data storage device comprising:

a read head and circuitry for reading said data sets;

an error corrector for performing error corrections;

a read controller for determining whether a result of said error correction is successful;

if said result of said error correction is unsuccessful, reading said valid data length data;

calculating an amount of good data from a start of said data set; comparing said amount of good data with said valid data length data; and depending upon the result of said comparison, generating a signal for accepting user data contained in set data set as valid or rejecting user data contained in set data set as invalid.

According to a third aspect of the present invention there is provided a method of recovering user data from a series of a plurality of data sets read from a data storage medium, each said data set comprising a plurality of sub data sets, each sub data set comprising a data field for storage of data, and an error correction code for error correcting a whole of said sub data set; said method comprising the steps of:

reading a first said data set;

determining whether any sub data sets within said first data set have errors which are uncorrectable by said error correction code;

if a sub data set having uncorrected errors is found, then determining an amount of correctly recovered data from data fields of other sub data sets, within a same data set as said erroneous sub data set in which said error occurred;

reading a valid data length data from a data field within said data set;

comparing said amount of correctly recovered data within said valid data length; and if said valid data length is less than an amount of correctly recovered data, then treating said data set as valid.

The invention includes a computer program comprising program instructions for:

reading a first data set;

determining whether any sub data sets within said first data have errors which are uncorrectable by an error correction code;

if a sub data set having uncorrectable errors is found, then determining an amount of correctly recovered data from other sub data sets within said first data set;

reading a valid data length from a data field within said first data set;

comparing an amount of data correctly recovered from said first data set with said valid data length; and if said valid data length is less than an amount of correctly recovered data, then treating said data set as valid.

The invention includes a computer program comprising program instructions which, when loaded into a re-configurable tape data storage device control said tape data storage device to:

read a first data set;

determine whether any sub data sets within said first data set have errors which are uncorrectable by an error correction code;

if a sub data set having uncorrected errors is found, then to determine an amount of correctly recovered data from data fields of other sub data sets of said first data set;

read a valid data length data from a data field within said data set;

compare said amount of correctly recovered data with said valid data length; and if said valid data length is less than an amount of correctly recovered data, then treat said data as valid.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which.

DETAILED DESCRIPTION OF THE BEST MODE FOR CARRYING OUT THE INVENTION

There will now be described by way of example the best mode contemplated by the inventors for carrying out the invention. In the following description numerous specific details are set forth in order to provide a thorough understanding of the present invention. It will be apparent however, to one skilled in the art, that the present invention may be practiced without limitation to these specific details. In other instances, well known methods and structures have not been described in detail so as not to unnecessarily obscure the present invention.

Within the known linear tape organization format, it is allowed that a data set is not completely filled with user data. In other words, there can be a portion of a data set which does not contain any data, and therefore which a user does not wish to recover. In the implementation described herein, such data is indicated in a data set information table (DSIT), by a valid data length field which indicates how much of the data set consists of user data.

Where an error in a sub data set occurs, firmware in a read channel of a tape drive device checks which sub data sets actually contain user data, by reading the valid data length field. If the erroneous sub data sets do not contact user data, then errors arising from those sub data sets are ignored and the users data is restored from the valid sub data sets containing user data to a host computer hosting the tape drive device.

Starting from the beginning of the data set, the first sub data set read from the data set needs to be correct and all subsequent sub data sets up to and including the sub data set containing the end of the user data which is to be read. Any errors occurring in further sub data sets after the end of the user data and within the same data set can be disregarded, and valid user data read from the sub data sets which do not contain errors can be recovered. However, if there is an error in a sub data set containing user date to be recovered, then that user data cannot be recovered for that sub data set.

Figure 5:
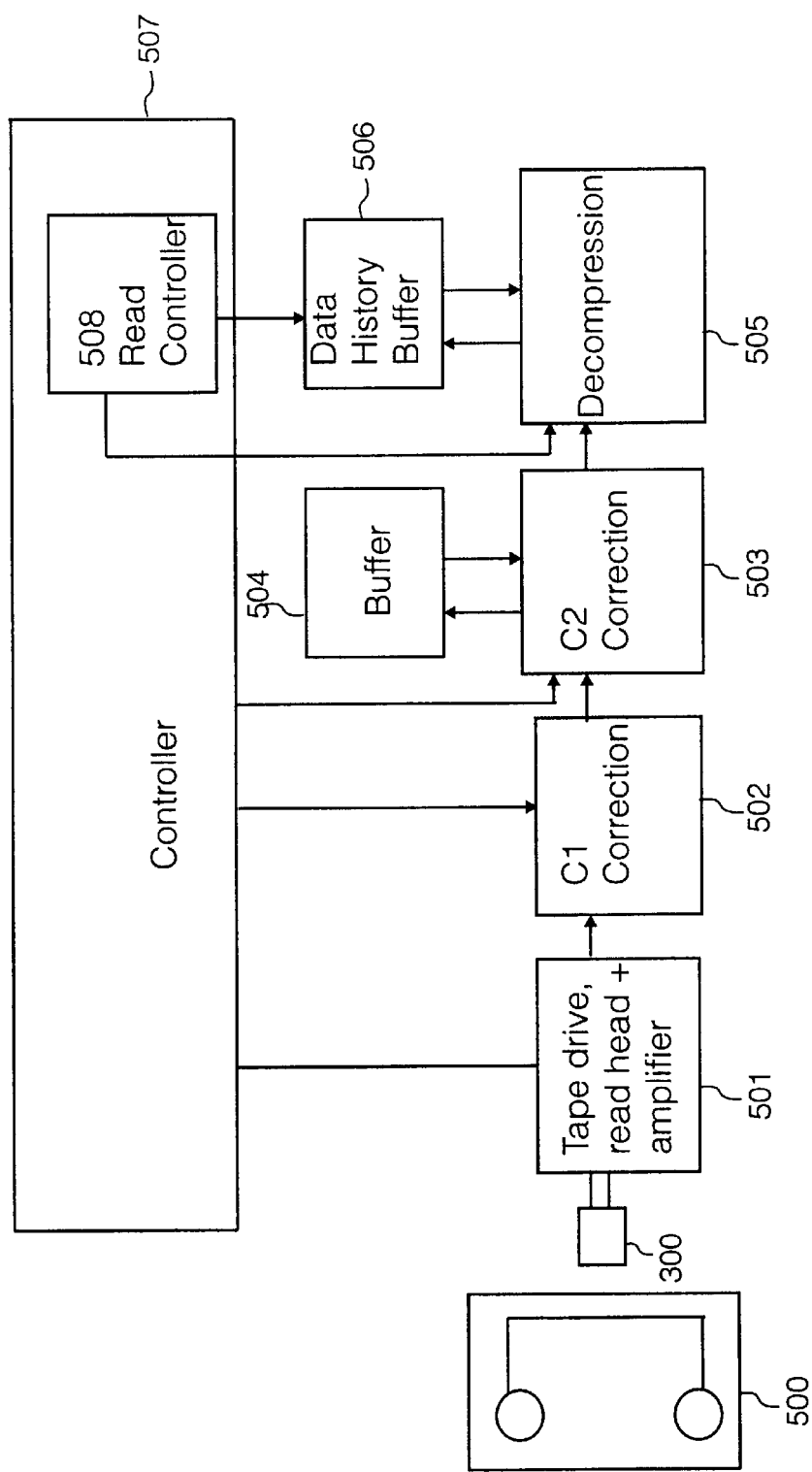
FIG. 5 illustrates schematically components of a read channel of a tape data storage device according to a specific implementation of the present invention.

Referring to FIG. 5 herein, there is illustrated schematically a read channel of a tape data storage device suitable for incorporation into a host computer device, for reading data from a linear tape medium, for example stored in a cassette cartridge 500. The read channel comprises a tape drive mechanism, read head and amplifier circuit 501 for reading data from the tape medium; a C1 corrector 502 for applying C1 error correction to an output data stream from the read head 501; a C2 corrector 503 for applying C2 correction to the C1 corrected output of the C1 corrector; a buffer memory 504 for storing complete sub data sets on which the C2 corrector 503 applies C2 correction; a decompressor 505 for applying decompression to the C1 and C2 corrected sub data sets; a data history buffer 506 for storing C1, C2 corrected sub data sets for operation of the decompressor 505 on those stored sub data sets; and a controller 507 for controlling data flow through the read head, C1 corrector, C2 corrector, buffer memory, decompressor and data history buffer, the controller 507 containing a read control component 508 for controlling the decompressor 505, read head and tape drive, and history buffer, to read user data from data sets according to a specific method of the present invention. The read controller component 508 which controls the decompressor 505 and data history buffer 506 for determining whether to accept or reject a data set as having valid user data, or as being erroneous.

Whilst the read head itself comprises and electro mechanical device as is known in the art, other components shown in FIG. 5 may be implemented either in hardware or as firmware, for example as an application specific integrated circuit (ASIC).

Figure 4:
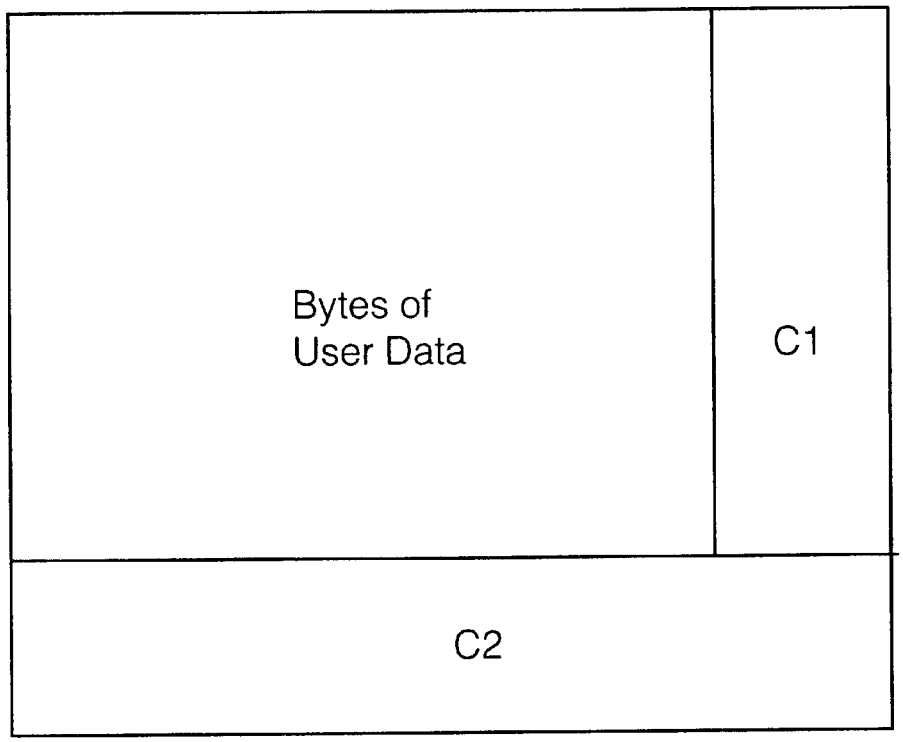
FIG. 4 illustrates schematically a logical layout of data within a sub data set comprising the data set of FIG. 2.
Figure 6:
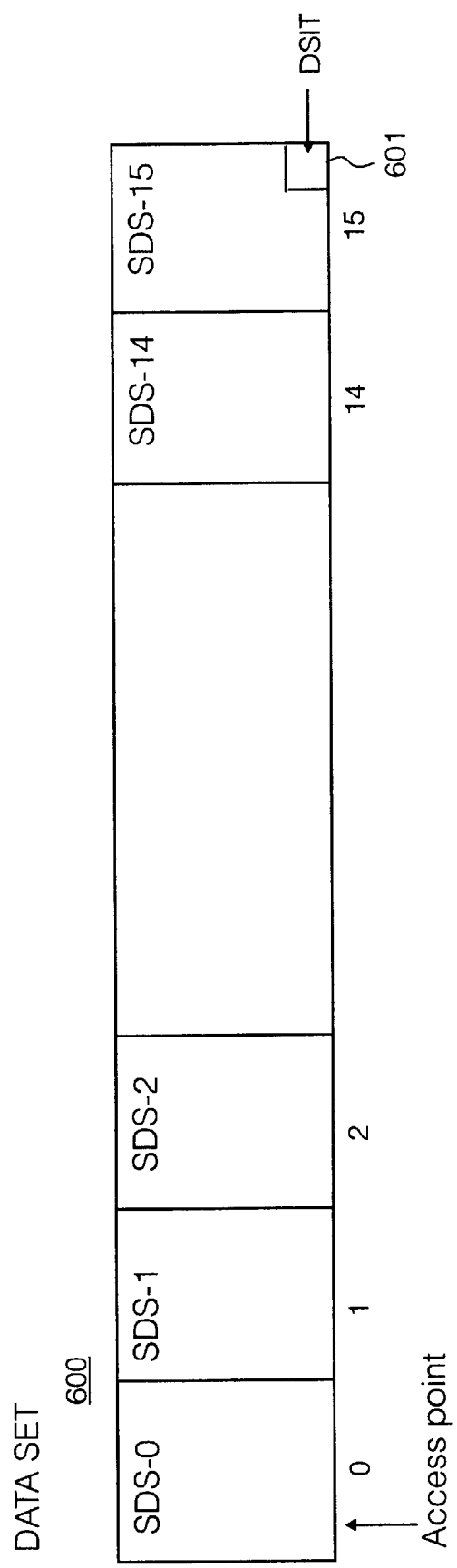
FIG. 6 illustrates schematically a logical layout of a data set read from tape by the read channel as shown in FIG. 5.

The read channel operates as follows:

Referring to FIG. 6 herein, there is illustrated schematically a logical layout of a data set according to a specific implementation of the present invention. The data set comprises 16 sub data sets SDS-0-SDS-15, each comprising 25,272 bytes of user data plus C1 and C2 correction as illustrated with reference to FIG. 4 herein. Additionally, at the end of the data set, there is provided a 468 byte data set information table (DSIT) 600, which contains information on the content of each sub data set within the data set 600.

Figure 7:
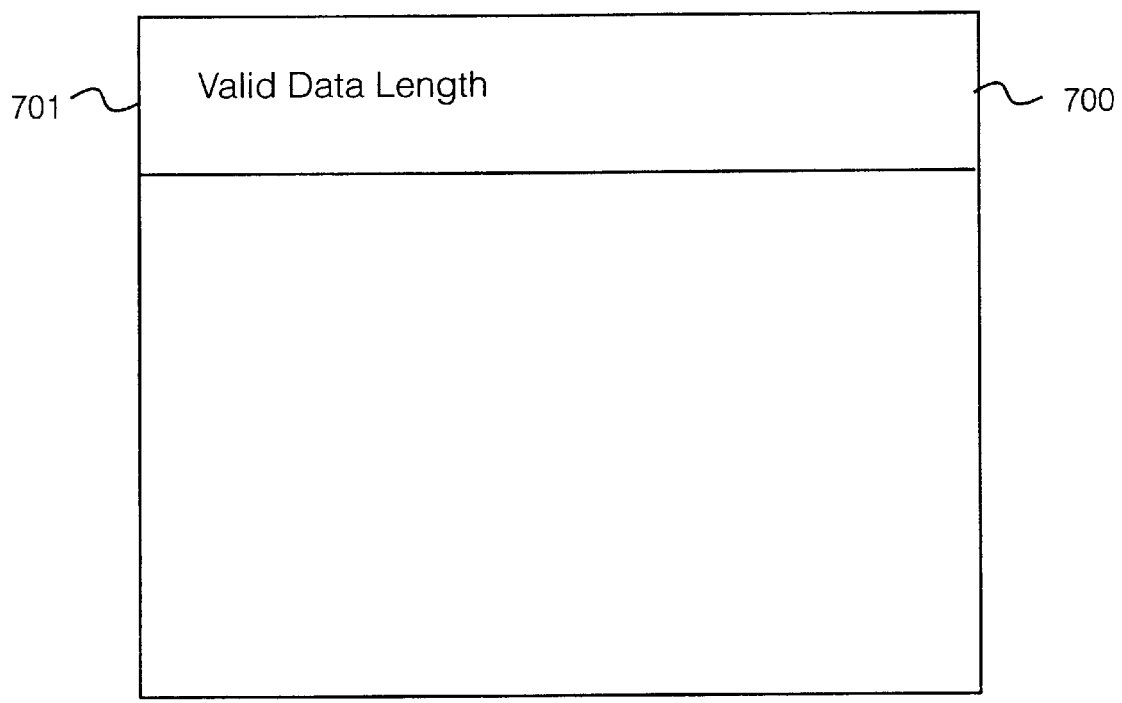
FIG. 7 illustrates schematically a data content of a data set information table comprising the data set of FIG. 6.

Referring to FIG. 7 herein, the data set information table contains a valid data length field 701, which indicates how many bytes in the whole data set contain compressed data which was stored from a host computer. Remaining data bytes in the data set could be padding bytes or invalid data. If the valid data length (VDL) is less than the number of sub data sets from the start of the data set, that is from the access point at the beginning of the data set, then the data set is deemed to be correct, for the purpose of recovering the user data. Even though there may be errors which are not C2 corrected, in sub data sets after the valid data length, because those sub data sets do not contain any user data, the data set as a whole can be taken as being valid.

Figure 8:
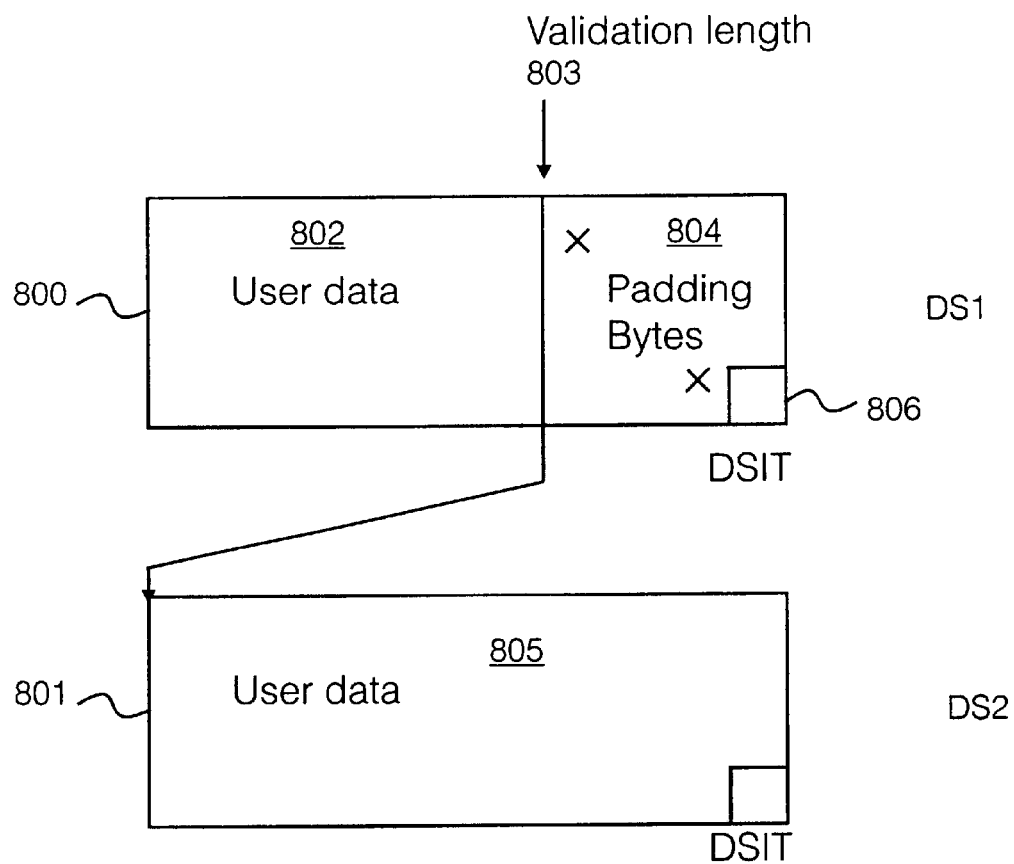
FIG. 8 illustrates schematically first and second data sets read sequentially from a tape data storage medium by the read channel of FIG. 5, where error bytes occur in the first data set.

Referring to FIG. 8 herein, there is illustrated schematically first and second data sets 800, 801 respectively read sequentially from a tape data storage medium. First data set 800 comprises a plurality of valid sub data sets containing user data shown as region 802, prior to a valid data length 803. After the valid data length subsequent sub data sets 804 within the first data set 800 contain padding bytes, some of which may contain errors, indicated X. The second data set 801 contains valid user data throughout.

In reading the user data, the tape drive device reads the valid user data 802 from the first data set, and accepts that user data as valid, even though errors occur in subsequent padding bytes 804, and continues on to read the subsequent user data 805 in subsequent sub data sets in the second data set 801. Information describing the position of the valid data length 803 within the first data set 800 is contained in the data set information table 806 on the first data set 800.

Figure 1:
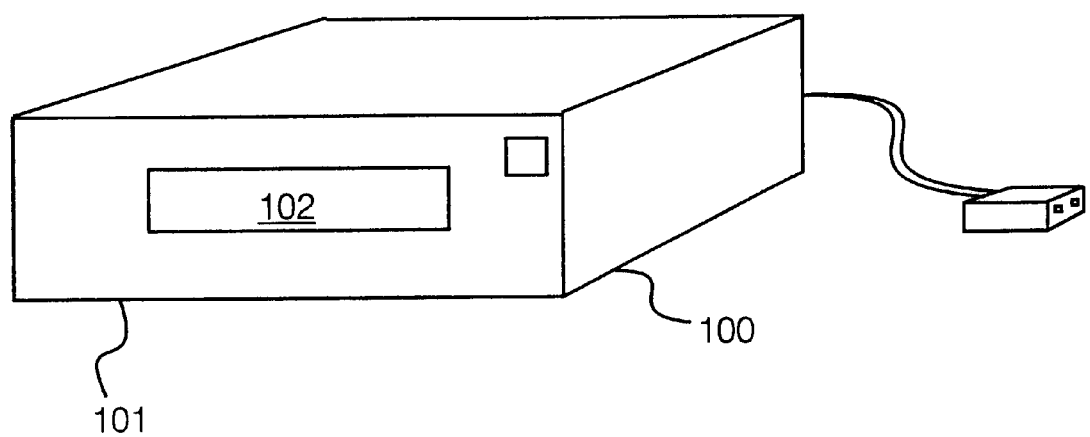
FIG. 1 illustrates schematically in perspective view, a prior art tape drive unit according to a linear tape open format (LTO), suitable for incorporation into a host computer for performing data backup operations on the host computer.
Figure 2:
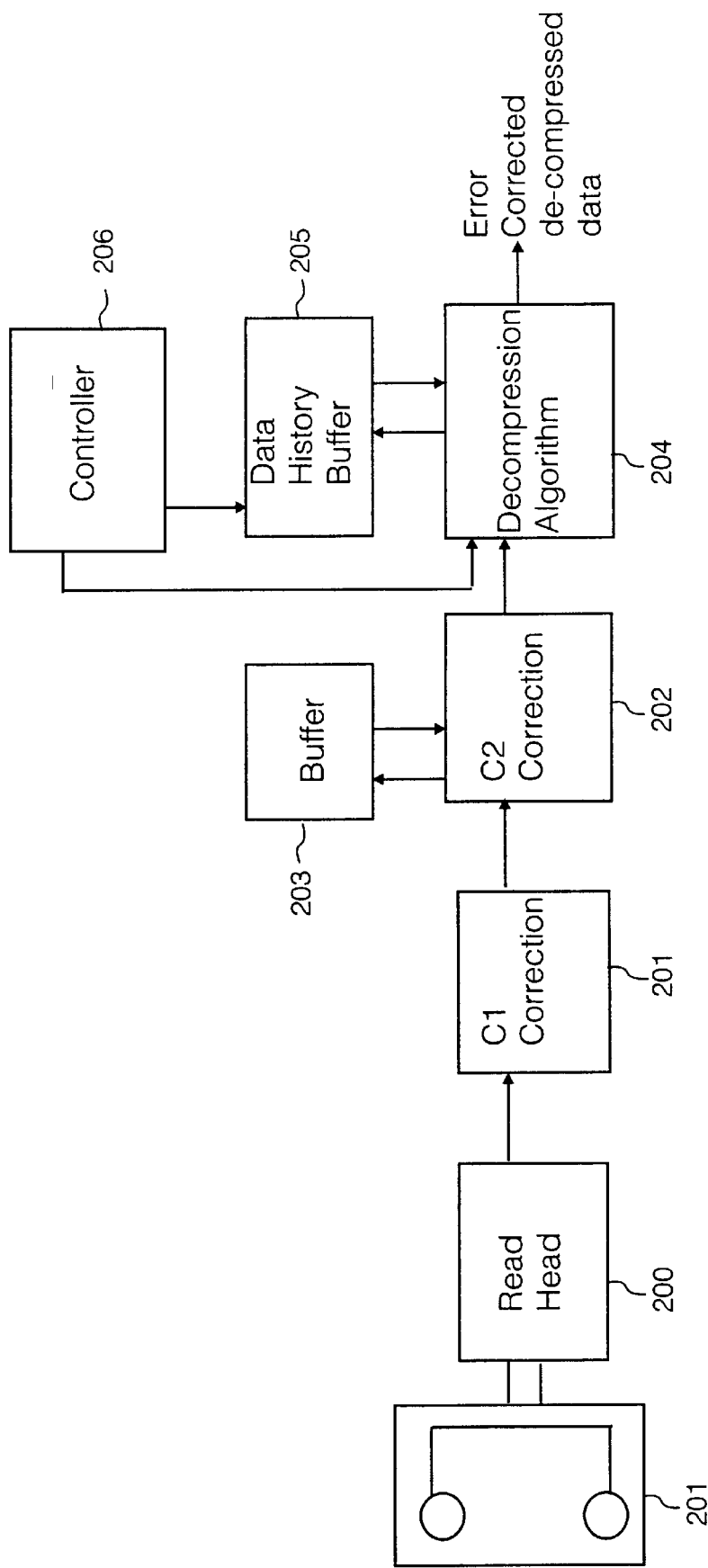
FIG. 2 illustrates schematically a read channel of a LTO format tape drive device, capable of reading and writing data to a linear tape cartridge.
Figure 3:
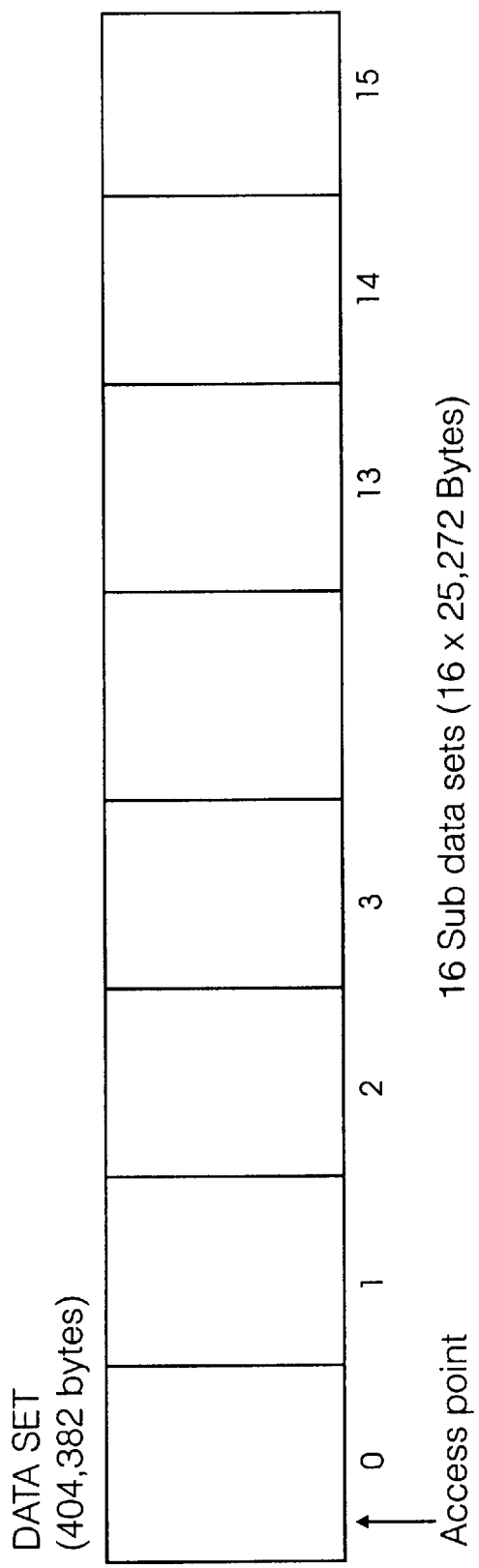
FIG. 3 illustrates schematically a logical layout of a prior art data set, written to a tape data storage cartridge.
Figure 9:
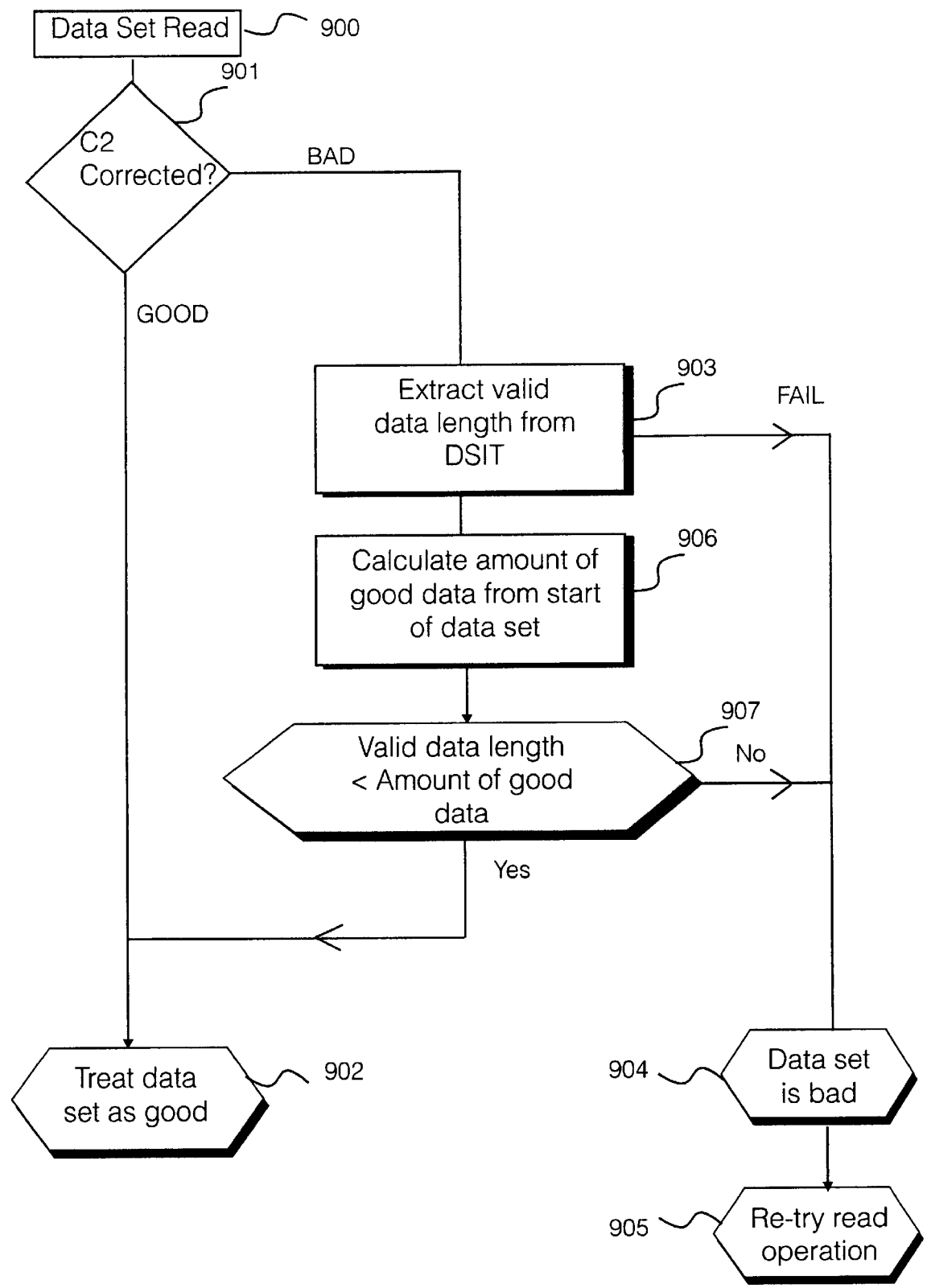
FIG. 9 illustrates schematically algorithm process steps carried out in the read channel of FIG. 5, for implementing a specific method according to the present invention.

Referring to FIG. 9 herein, there is illustrated schematically process steps carried out by read controller 508 for determining whether a read data set can be treated as valid. The process of FIG. 9 is implemented by firmware designed into the read controller 508, for implementation as a separate process after the process of reading the data set, applying C1 and C2 correction, and applying decompression. In the best mode implementation, a known tape drive as illustrated in FIG. 2 herein can be upgraded by download of software to control the known controller to operate the algorithm as show in FIG. 9 herein, thereby creating a read controller component 508 in a prior art tape data storage device.

In step 900 the data set is read, as is known in the art. In step 901, it is checked whether the C2 correction operated correctly on the data set. If C2 correction was successful, then in step 902, the data set is treated as completely valid. However, if in step 901, C2 correction was not successful then the data set is treated as bad and the process proceeds to extract the valid data length (VDL) information from the data set information table 601. If the valid data length cannot be extracted, for example because the final sub data set is corrupted, then the whole data set is treated as invalid in step 904, and a re-read operation of the complete data set is activated in step 905. Re-reading of the data step may occur a pre-determined number of times, until the controller ceases to retry reading the data set. Provided the data set information table and the valid data length can be read, then in step 906 the controller determines the amount of good data in the data step, referenced to the access point at the start of the data set. The amount of good data is equal to the number of good sub data sets recovered×25,272 bytes, since each sub data sets contains this amount of user data. In step 907, if the valid data length is less than the determined amount of good data then the algorithm proceeds to step 902 and treats the data set as a good data set. However, if the valid data length is greater than the amount of good data, then this indicates that not enough good user data has been recovered from the data set, and there is user data which is not recovered, in which case the algorithms proceeds to step 904 treating the data set as bad and then retries a data set re-operation in step 905 for a per-determined number of times.

If, as in the case of first data set 800, a data set containing bad data, occurring after the valid data length is treated as a good data set following the algorithm of FIG. 9, then subsequent data sets, for example second data set 801 can rely on the recovered user data from the first data set as being valid user date, for the purposes of applying the decompression process via decompressor 505 and data history buffer 506. When the user data is read back to the host computer, the first portion of user data 802 is immediately followed by the second portion of user data 805 from the second data set, and the erroneous padding bytes 804 are not used for the purpose of decompression.

Figure 10:
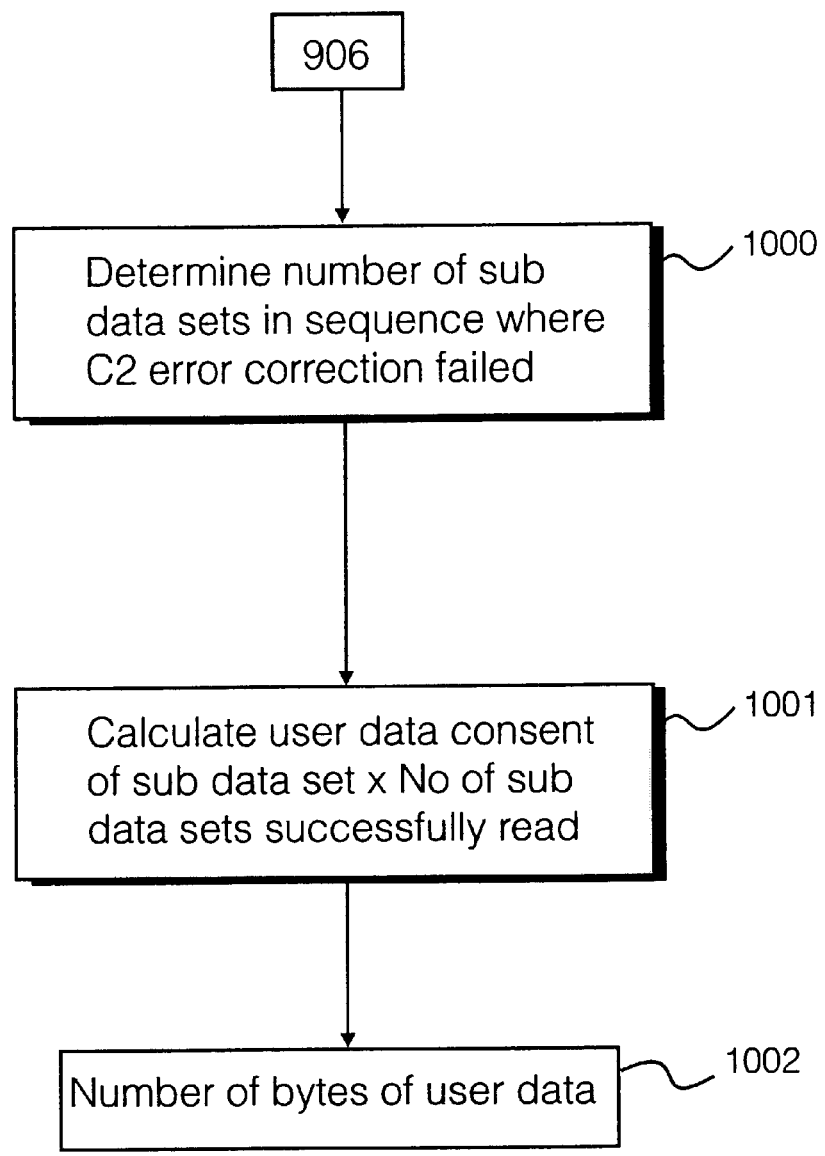
FIG. 10 illustrates schematically process steps for determination of an amount of good user date from the start of a data set.

Referring to FIG. 10 herein, there is illustrated schematically process steps carried out by the controller to calculate the amount of good date from the start of the data step. In step 1000, there is counted the number of sub data sets read from the current data set up to the sub data set where C2 error correction failed. In step 1001, there is calculated the user data amount as the number of successfully read sub data sets containing user data times the amount of user data contained in a sub data set (nominally 25,272 bytes in the best mode). This gives the number of bytes of user data 1002 read from the currently examined data set, immediately prior to the sub data set in which an error occurred. This is the value which is compared with the valid data length in step 907 as herein before described to determine whether the user data from that data set can be used, or the data set needs to be re-read.

What is claimed is:

1. A method of recovering user data from a data storage medium, wherein said user data is stored on said data storage medium in the format:

a data set comprising a plurality of sub data sets;

each said sub data set comprising a data portion capable of storing user data, a C1 error correction code, and a C2 error correction code; and said data set comprising a valid data length data describing a number of bytes of said data set comprising said user data within said data set;

said method comprising the steps of:

reading at least one said data set;

performing C2 error correction;

determining whether a result of said C2 error correction is successful;

if said result of said C2 error correction is unsuccessful, reading said valid data length data;

determining an amount of good data from a start of said data set;

comparing said amount of good data with said valid data length data; and depending upon a result of said comparison, accepting user data contained in set data set as valid or rejecting user data contained in said data set as invalid.

2. The method as claimed in claim 1 further comprising the step of:

if as a result of said comparison, said user data is rejected as being invalid, re-reading said data set.

3. The method as claimed in claim 1, wherein said step of determining an amount of good data comprises:

counting a number of sub data sets containing user data, successfully read;

multiplying the number of successfully read sub data sets containing user data by the number of bytes of user data per sub data set to obtain a number of bytes of successfully read user data.

4. The method as claimed in claim 1, wherein said step of accepting user data contained in said data set as valid depending upon a result of said comparison comprises:

if said determined amount of good data is greater than said valid data length, then accepting said user data as valid.

5. The method as claimed in claim 1, wherein said step of rejecting user data contained in said data set as invalid depending upon result of said comparison comprises:

if said determined amount of good data is less than said valid data length; then rejecting said user data as invalid.

6. A data storage device capable of recovering user date from a data storage medium, wherein said user data is stored on said data storage medium in the format:

at least one data set comprising a plurality of sub data sets;

each said sub data set comprising a data portion capable of storing user data and an error correction code; and said data set comprising a valid data length data describing a number of bytes of said data set comprising said user data within said data set;

said data storage device comprising:

a read head and circuitry for reading said data sets;

an error corrector for performing error correction;

a read controller for determining whether a result of said error correction is successful;

if said result of said error correction is unsuccessful, reading said valid data length data;

calculating an amount of good data from a start of said data set;

comparing said amount of good data with said valid data length data; and depending upon the result of said comparison, generating a signal for accepting user data contained in said data set as valid or rejecting user data contained in said data set as invalid.

7. The data storage device as claimed in claim 6 further wherein said read controller operates such that:

If as a result of said comparison, said user data is rejected as being invalid, said read controller operates to control said read head and circuitry to re-read said data set.

8. The data storage device as claimed in claim 6, wherein said read controller operates to:

count a number of successfully read sub data sets containing user data; and multiply the number of successfully read data sets containing user data by the number of bytes of user data per sub data set to obtain a number of bytes of successfully read user data.

9. A method of recovering user data from a series of a plurality of data sets read from a data storage medium, each said data set comprising a plurality of sub data sets, each sub data set comprising a data field for storage of data, and an error correction code for error correcting a whole of said sub data set; said method comprising the steps of:

reading a first said data set;

determining whether any sub data sets within said data set have errors which are uncorrectable by said error correction code;

if a sub data set having uncorrected errors is found, then determining an amount of correctly recovered data from data fields of sub data sets within a same data set as said erroneous sub data set in which said error occurred;

reading a valid data length data from a data field within said data set;

comparing said amount of data correctly recovered with said valid data length; and if said valid data length is less than an amount of correctly recovered data, then treating said data set as valid.

10. The method as claimed in claim 9, further comprising the steps of:

reading a second data set;

applying a compression process to said second data set, based upon said validly recovered data read from said first data set.

11. The method as claimed in claim 10, wherein said data of said second data set is read contiguously with data terminated at said valid data length of said first data set.

12. A computer program comprising program instructions for:

reading a first data set;

determining whether any sub data sets within said first data set have errors which are uncorrectable by an error correction code;

if a sub data set having uncorrectable errors is found then determining an amount of correctly recovered data from other sub data sets within said first data set;

reading a valid data length data from a data field within said first data set;

comparing an amount of data correctly recovered from said first data set with said valid data length; and if said valid data length is less than an amount of correctly recovered data, then treating said data set as valid.

13. A computer program according to claim 12 embodied on a record medium.

14. A computer program according to claim 12 carried on an electrical carrier signal.

15. A computer program according to claim 12 embodied in a read only memory.

16. A computer program according to claim 12 stored in a computer memory.

17. A computer program comprising program instructions which, when loaded into a re-configurable tape data storage device control said tape data storage device to:

read a first data set;

determine whether any sub data sets within said first data set have errors which are uncorrectable by an error correction code;

if a sub data set having uncorrected errors is found, then to determine an amount of correctly recovered data from data fields of other sub data sets of said first data set;

read a valid data length data from a data field within said data sets;

compare said amount of correctly recovered data with said valid data length; and if said valid data length is less than an amount of correctly recovered data, then treat said data set as valid.

* * * * *